(12) United States Patent
Wang et al.

(10) Patent No.: US 11,699,745 B2
(45) Date of Patent: Jul. 11, 2023

(54) THYRISTOR

(71) Applicant: MACRONIX International Co., Ltd., Hsinchu (TW)

(72) Inventors: Shih-Yu Wang, Taipei (TW); Wen-Tsung Huang, Changhua County (TW); Chih-Wei Hsu, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 82 days.

(21) Appl. No.: 17/513,535

(22) Filed: Oct. 28, 2021

(65) Prior Publication Data

US 2023/0133016 A1  May 4, 2023

(51) Int. Cl.
*H01L 29/74* (2006.01)
*H01L 29/10* (2006.01)

(52) U.S. Cl.
CPC ........ *H01L 29/7408* (2013.01); *H01L 29/102* (2013.01); *H01L 29/1016* (2013.01)

(58) Field of Classification Search
None
See application file for complete search history.

(56) References Cited

U.S. PATENT DOCUMENTS

| | | | | |
|---|---|---|---|---|
| 11,342,323 | B2 * | 5/2022 | Salcedo | ............... H01L 29/402 |
| 2005/0104155 | A1 | 5/2005 | Jensen | |
| 2007/0023866 | A1 * | 2/2007 | Chatty | .................. H01L 29/732 |
| | | | | 257/E29.183 |
| 2008/0054297 | A1 * | 3/2008 | Ker | ..................... H01L 29/7436 |
| | | | | 257/168 |
| 2008/0217650 | A1 * | 9/2008 | Morishita | ........... H01L 29/7436 |
| | | | | 257/E29.225 |

FOREIGN PATENT DOCUMENTS

| | | |
|---|---|---|
| TW | 200509360 | 3/2005 |
| TW | 200522334 | 7/2005 |

OTHER PUBLICATIONS

"Office Action of Taiwan Counterpart Application", dated Oct. 17, 2022, pp. 1-5.

* cited by examiner

*Primary Examiner* — Khaja Ahmad
(74) *Attorney, Agent, or Firm* — J.C. Patents

(57) ABSTRACT

A thyristor includes a first transistor and a second transistor. The first transistor has a first end serving as an anode end. The second transistor has a control end coupled to a second end of the first transistor, a first end coupled to a control end of the first transistor, and a second end coupled to the first end of the second transistor and serving as a cathode end.

20 Claims, 6 Drawing Sheets

100

200

THYRISTOR

BACKGROUND

Technical Field

The disclosure relates to a thyristor, and particularly, to a thyristor that can be turned on quickly.

Description of Related Art

In the conventional technical field, it is a common practice to construct an electrostatic protection circuit with a diode. However, in high-speed application, as the parasitic capacitance of the diode is limited, the current discharge capability of the electrostatic protection circuit is also limited, affecting the capability of electrostatic discharge protection.

SUMMARY

The disclosure provides a variety of thyristors, in which the turn-on speed can be increased.

In the disclosure, a thyristor includes a first transistor and a second transistor. The first transistor has a first end serving as an anode end. The second transistor has a control end coupled to a second end of the first transistor, a first end coupled to a control end of the first transistor, and a second end coupled to the first end of the second transistor and serving as a cathode end.

In the disclosure, another thyristor includes a substrate, a first heavily doped region, a second heavily doped region, a third heavily doped region, and a first well region. The first heavily doped region is disposed in the substrate and electrically coupled to an anode end. The second heavily doped region is disposed in the substrate and is electrically coupled to a cathode end. The first well region is disposed in the substrate. The third heavily doped region is disposed in the first well region and is electrically coupled to the cathode end.

Based on the foregoing, in the thyristors of the disclosure, an embedded diode is formed between the first heavily doped region (the second end of the first transistor) and the substrate (the control end of the first transistor). When a forward bias is received between the anode end and the cathode end of the thyristor, the embedded diode can assist the thyristor to be turned on, and the first well region (the second end of the first transistor and the control end of the second transistor) can also assist the thyristor to be turned on at the same time. Therefore, the conduction speed of the thyristor can be effectively increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
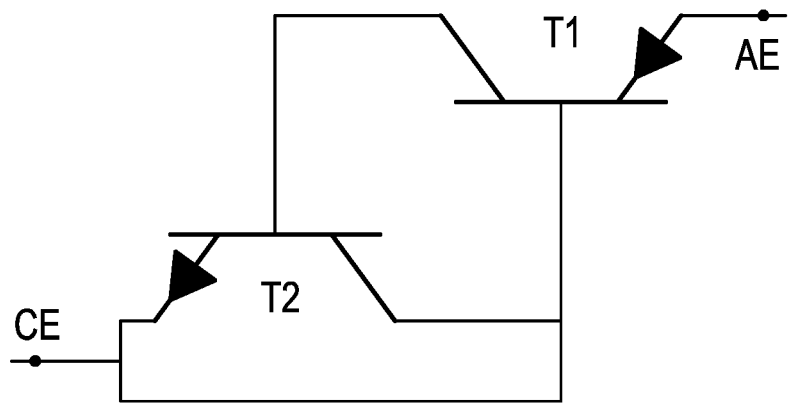
FIG. 1 is a schematic diagram showing a circuit of a thyristor according to an embodiment of the disclosure.

With reference to FIG. 1, which is a schematic diagram showing a circuit of a thyristor according to an embodiment of the disclosure, a thyristor 100 includes a transistor T1 and a transistor T2. The transistor T1 has a first end serving as an anode end AE of the thyristor 100. The transistor T1 has a second end coupled to a control end of the transistor T2, and a control end coupled to a first end of the transistor T2. In addition, the transistor T2 has a second end coupled to the first end of the transistor T2 and serving as a cathode end CE of the thyristor 100.

In this embodiment, the first end of the transistor T1 may be an emitter of the transistor T1; the second end of the transistor T1 may be a collector of the transistor T1; and the control end of the transistor T1 may be a base of the transistor T1. In addition, the second end of the transistor T2 may be an emitter of the transistor T2; the first end of the transistor T2 may be a collector of the transistor T2; and the control end of the transistor T2 may be a base of the transistor T2. An electrical conduction type of the transistor T1 is complementary to an electrical conduction type of the transistor T2. Specifically, the transistor T1 is a PNP-type bipolar transistor, and the transistor T2 is an NPN-type bipolar transistor.

In this embodiment, an embedded diode may be formed between the first end and the control end of the transistor T1. When a forward bias is received between the anode end AE and the cathode end CE of the thyristor 100, a conduction path may be formed between the embedded diode between the first end of the transistor T1 and the control end of the transistor T1 and the second end of the transistor T2. In addition, the voltage on the second end of the transistor T1 which is floating at this time is pulled up because of the conduction of the embedded diode. Besides, another conduction path may be formed between the first end of the transistor T1, the control end of the transistor T1, the first end of the transistor T2, the second end of the transistor T1, the control end of the transistor T2 and the second end of the transistor T2. Under this condition, the thyristor 100 can be quickly turned on.

In the application of electrostatic discharge protection, when electrostatic discharge occurs, in response to the electrostatic discharge voltage between the anode end AE and the cathode end CE, the thyristor 100 can be quickly turned on, and the discharge of electrostatic discharge current can be effectively achieved through dual conduction paths, effectively improving the level of electrostatic discharge protection.

Figure 2:
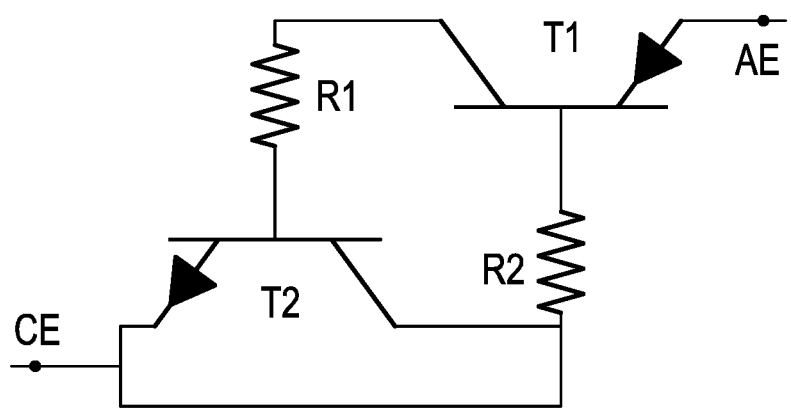
FIG. 2 is a schematic diagram showing a circuit of a thyristor according to another embodiment of the disclosure.

With reference to FIG. 2, which is a schematic diagram showing a circuit of a thyristor according to another embodiment of the disclosure, a thyristor 200 includes the transistor T1, the transistor T2, a resistor R1, and a resistor R2. Different from the embodiment of FIG. 1, the resistor R1 is coupled between the second end of the transistor T1 and the control end of the transistor T2. The resistor R2 is coupled between the first end of the transistor T2 and the control end of the transistor T1. The resistors R1 and R2 may be resistors formed by semiconductor materials between the transistor T1 and the transistor T2 in an integrated circuit.

Figure 3A:
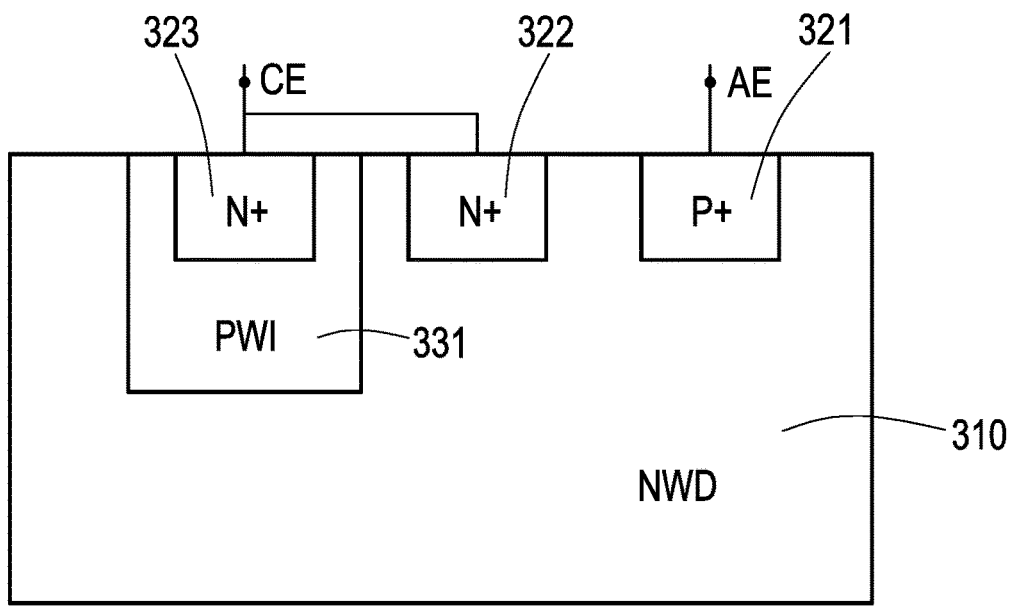
FIG. 3A is a schematic diagram showing a structure of a thyristor according to an embodiment of the disclosure.

Reference may be to FIG. 3A for description below. FIG. 3A is a schematic diagram showing a structure of a thyristor according to an embodiment of the disclosure. A thyristor 301 includes a substrate 310 constructed by a well region, a first heavily doped region 321, a second heavily doped region 322, a third heavily doped region 323, and a well region 331. The substrate 310 may be an N-type deep well (NWD). The first heavily doped region 321 may be a P-type heavily doped region (P+) and may be disposed in the substrate 310. The second heavily doped region 322 may be an N-type heavily doped region (N+) and may be disposed in the substrate 310. The well region 331 may be a P-type deep well region (PWI) and may be disposed in the substrate 310. The third heavily doped region 323 may be an N-type heavily doped region (N+) and may be disposed in the well region 331.

Wherein, the well region 331 is disposed in the substrate 310 which is N-type deep well (NWD) region, and surrounded by N-type well region. Such as that, the well region 331 is a P-type well inside (PWI) region.

That is, in this embodiment, electrical conduction types of the substrate 310, the second heavily doped region 322, and the third heavily doped region 323 are the same (N type). Electrical conduction types of the first heavily doped region 321 and the well region 331 are the same (P type).

In this embodiment, the first heavily doped region 321, the substrate 310, and the well region 331 may form the transistor T1 as shown in FIG. 1. The substrate 310, the third heavily doped region 323, and the well region 331 may form the transistor T2 as shown in FIG. 1. In addition, the first heavily doped region 321 is electrically coupled to the anode end AE of the thyristor 301, and the substrate 310, the second heavily doped region 322 and the third heavily doped region 323 are jointly coupled to the cathode end CE of the thyristor 301. Compared to the embodiment of FIG. 1, the first heavily doped region 321 corresponds to the first end (emitter) of the transistor T1; the substrate 310 corresponds to the control end (base) of the transistor T1; and the well region 331 corresponds to the second end (collector) of the transistor T1. Furthermore, the substrate 310 corresponds to the first end (collector) of the transistor T2; the well region 331 corresponds to the control end (base) of the transistor T2; and the third heavily doped region 323 corresponds to the second end (emitter) of the transistor T2.

In the embodiment, an embedded diode may be formed between the first heavily doped region 321 and the substrate 310. When a forward bias is received between the anode end AE and the cathode end CE of the thyristor 301, a conduction path may be formed between the embedded diode formed by the first heavily doped region 321 and the substrate 310 and the second heavily doped region 322. In addition, the voltage on the well region 331 which is floating at this time is pulled up because of the conduction of the embedded diode. Accordingly, the well region 331 and the third heavily doped region 323 may form another conduction path. Under this condition, the thyristor 301 can be quickly turned on. In the application of electrostatic discharge protection, the discharge efficiency of electrostatic discharge current can be accelerated and the level of protection can be improved.

Figure 3B:
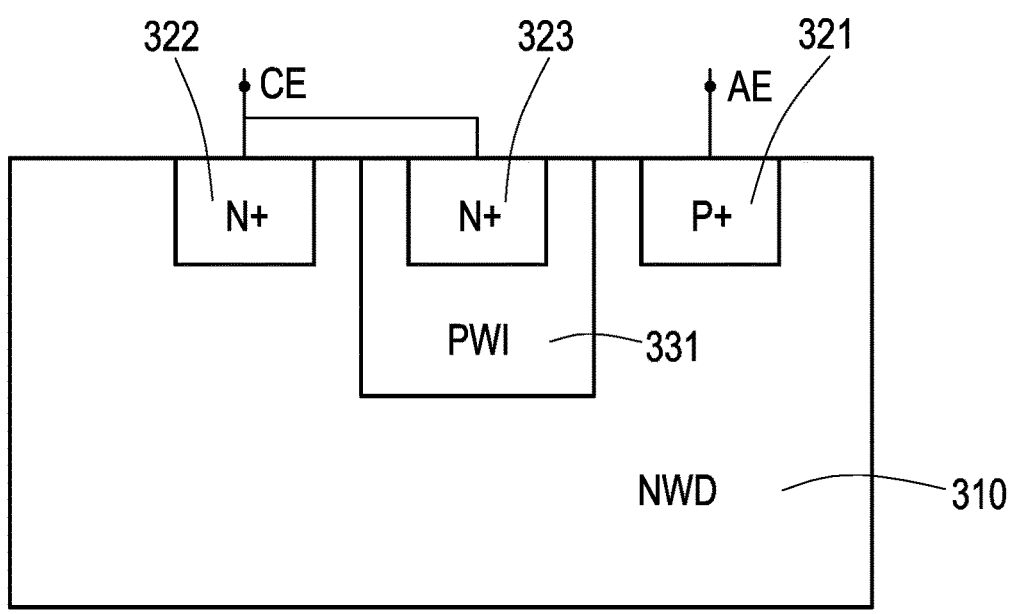
FIG. 3B is a schematic diagram showing a structure of a thyristor according to another embodiment of the disclosure.

Notably, in this embodiment, the first heavily doped region 321, the second heavily doped region 322, and the third heavily doped region 323 are sequentially disposed in the substrate 310. For other embodiments of the disclosure, reference may be made to FIG. 3B, which is a schematic diagram showing a structure of a thyristor according to another embodiment of the disclosure. In a thyristor 302, the third heavily doped region 323 disposed in the well region 331 may as well be disposed between the first heavily doped region 321 and the third heavily doped region 323. That is, the positions of the first heavily doped region 321, the second heavily doped region 322, and the third heavily doped region 323 are not limited.

Figure 4:
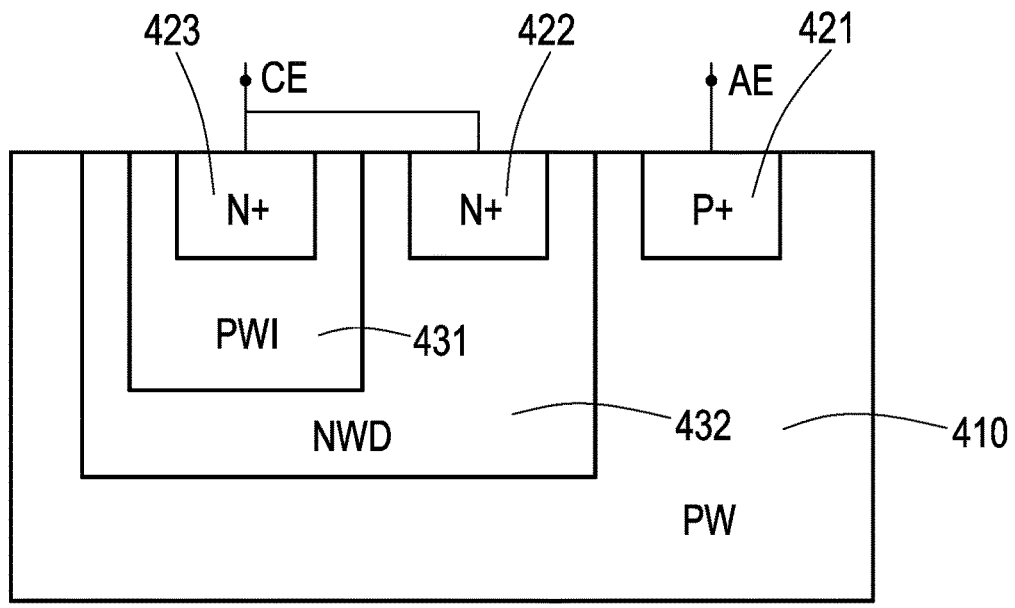
FIG. 4 is a schematic diagram showing a structure of a thyristor according to another embodiment of the disclosure.

Reference may be to FIG. 4 for description below. FIG. 4 is a schematic diagram showing a structure of a thyristor according to another embodiment of the disclosure. A thyristor 400 includes a substrate 410 constructed by a P-type well region (PW), a first heavily doped region 421, a second heavily doped region 422, a third heavily doped region 423, a well region 431, and a deep well region 432. In this embodiment, the substrate 410 is a P-type well (PW) substrate. The first heavily doped region 421 is a P-type heavily doped region (P+). The second heavily doped region 422 and the third heavily doped region 423 are each an N-type heavily doped region (N+). The well region 431 is a P-type well inside region (PWI). The deep well region 432 is an N-type deep well region (NWD).

In terms of the configuration, the first heavily doped region 421 and the deep well region 432 are directly disposed in the substrate 410. The well region 431 is disposed in the deep well region 432. The second heavily doped region 422 is disposed outside the well region 431 and is disposed in the deep well region 432. The third heavily doped region 423 is disposed in the well region 431.

The first heavily doped region 421 is electrically connected to the anode end AE of the thyristor 400. The second heavily doped region 422 and the third heavily doped region 423 are each electrically connected to the cathode end CE of the thyristor 400.

Corresponding to the embodiment of FIG. 1, the substrate 410, the deep well region 432, and the well region 431 in this embodiment may form the transistor T1. The third heavily doped region 423, the deep well region 432, and the well region 431 may form the transistor T2. An embedded diode may be formed between the first heavily doped region 421, the substrate 410 and the deep well region 432. In an initial state, the well region 431 is floating.

When a forward bias is received between the anode end AE and the cathode end CE of the thyristor 400, the embedded diode between the substrate 410 and the deep well region 432 can be turned on and provide a conduction path. The voltage on the well region 431 which was originally floating is pulled up because of the conduction of the embedded diode. Accordingly, the well region 431 and the third heavily doped region 423 may provide another conduction path, effectively improving the conduction efficiency of the thyristor 400.

In this embodiment, by increasing the junction between the substrate 410 and the deep well region 432, the capacitance provided by the depletion region of the embedded diode generated between the substrate 410 and the deep well region 432 can be reduced, and the conduction efficiency of the embedded diode can be improved.

Notably, in this embodiment, the second heavily doped region 422 may be disposed between the first heavily doped region 421 and the third heavily doped region 423 as shown in FIG. 4. In other embodiments of the disclosure, the third heavily doped region 423 disposed in the well region 431 may as well be disposed between the first heavily doped region 421 and the second heavily doped region 422, with no specific limits.

Figure 5:
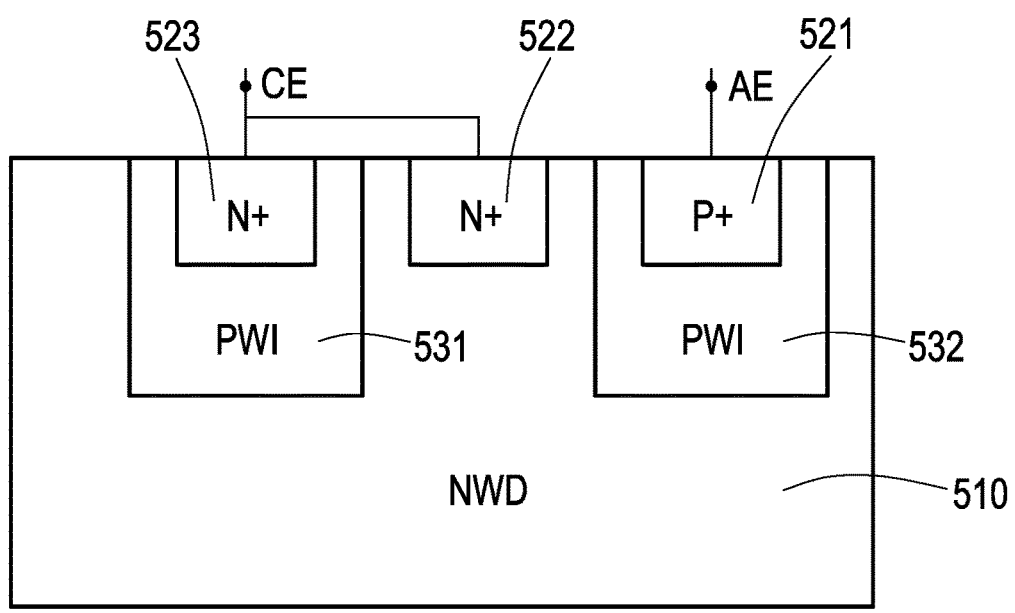
FIG. 5 is a schematic diagram showing a structure of a thyristor according to another embodiment of the disclosure.

Next, with reference to FIG. 5, which is a schematic diagram showing a structure of a thyristor according to another embodiment of the disclosure, a thyristor 500 includes a substrate 510 constructed by a well region, a first heavily doped region 521, a second heavily doped region 522, a third heavily doped region 523, a first well region 531, and a second well region 532. In this embodiment, the substrate 510 is an N-type deep well (NWD). The first heavily doped region 521 is a P-type heavily doped region (P+). The second heavily doped region 522 and the third heavily doped region 523 are each an N-type heavily doped region (N+). The well region 531 and the well region 532 are each a P-type well inside regions (PWI).

In terms of configuration, the second heavily doped region 522, the well region 531, and the well region 532 are directly disposed in the substrate 510. The first heavily doped region 521 is disposed in the well region 532. The second heavily doped region 522 is disposed outside the well region 531 and outside the second well region 532. The third heavily doped region 523 is disposed in the well region 531. The well region 531 and the well region 532 are physically isolated from each other.

The first heavily doped region 521 is electrically connected to the anode end AE of the thyristor 500. The second heavily doped region 522 and the third heavily doped region 523 are each electrically connected to the cathode end CE of the thyristor 500.

In this embodiment, an embedded diode may be formed between the first heavily doped region 521, the well region 532, and the substrate 510. In an initial state, the well region 531 is floating.

When a forward bias is received between the anode end AE and the cathode end CE of the thyristor 500, the embedded diode between the first heavily doped region 521, the well region 532, and the substrate 510 can be turned on and provide a conduction path. The voltage on the well region 531 which was originally floating is pulled up because of the conduction of the embedded diode. Accordingly, the well region 531 and the third heavily doped region 523 may provide another conduction path, effectively improving the conduction efficiency of the thyristor 500.

Figure 6:
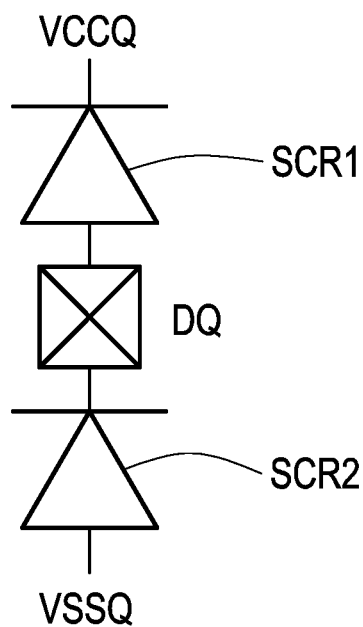
FIG. 6 is a schematic diagram showing an electrostatic discharge protection circuit according to an embodiment of the disclosure.

With reference to FIG. 6, which is a schematic diagram showing an electrostatic discharge protection circuit according to an embodiment of the disclosure, an electrostatic discharge protection circuit 600 includes thyristors SCR1 and SCR2. A cathode end of the thyristor SCR1 receives a power supply voltage VCCQ, and an anode end of the thyristor SCR1 is coupled to a pad DQ. A cathode end of the thyristor SCR2 is coupled to the pad DQ, and an anode end of the thyristor SCR2 receives a reference ground voltage VSSQ. In this embodiment, the thyristor SCR1 may be implemented by applying the thyristor 301 of FIG. 3A or the thyristor 500 of FIG. 5, and the thyristor SCR2 may be implemented by applying the thyristor 301 of FIG. 3A, the thyristor 400 of FIG. 4, or the thyristor 500 of FIG. 5. In the electrostatic discharge protection circuit 600, the level of electrostatic discharge protection can be effectively improved under the condition of applying the thyristors SCR1 and SCR2 which can be turned on quickly.

Figure 7A:
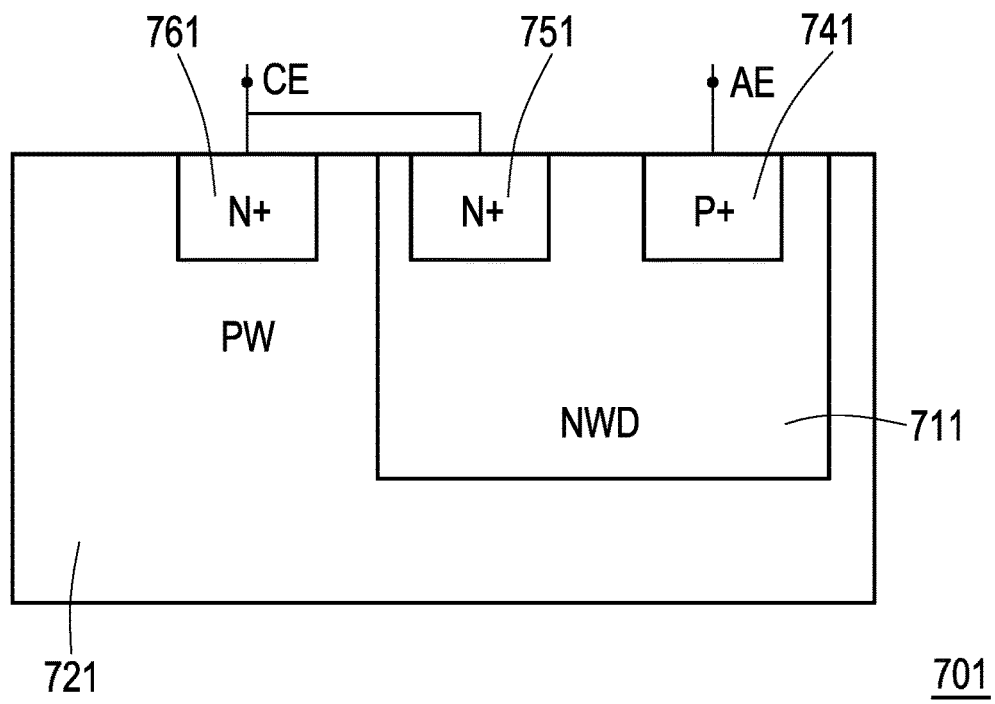
FIG. 7A to FIG. 7D are schematic diagrams showing structures of thyristor according to a plurality of embodiments of the disclosure.

Please refer to FIG. 7A to FIG. 7D, which are schematic diagrams showing structures of thyristor according to a plurality of embodiments of the disclosure. In FIG. 7A, a thyristor 701 includes well regions 711, 721 and heavily doped region 741, 751 and 761. The well region 721 can be a substrate. The well region 711 is disposed in the well region 721, where the well region 721 may be a P-type well region (PW). The well region 711 may be a N-type deep well region (NWD). The heavily doped regions 741 and 751 are disposed in the well region 711, and the heavily doped region 761 is disposed in the well region 721. The heavily doped region 741 is electrically connected an anode end AE of the thyristor 701, and the heavily doped regions 751, 761 are common electrically connected to a cathode end CE of the thyristor 701. The heavily doped region 741 is a P-type heavily doped region (P+), and heavily doped regions 751 and 761 are N-type heavily doped regions (N+).

Figure 7B:
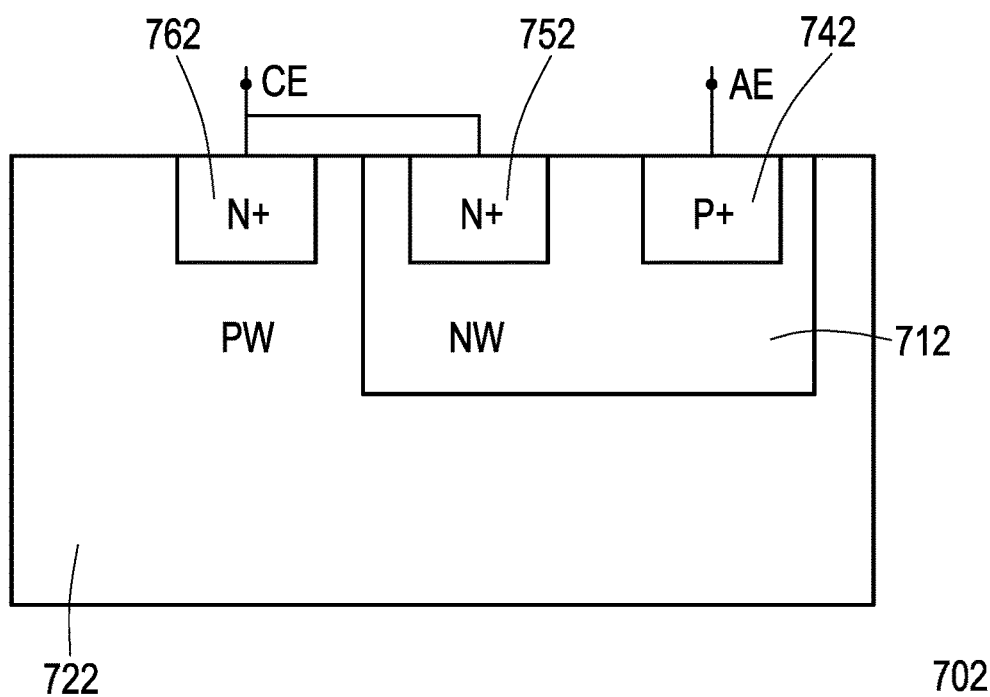

In FIG. 7B, a thyristor 702 includes well regions 712, 722 and heavily doped region 742, 752 and 762. The well region 722 can be a substrate. The well region 712 is disposed in the well region 722, where the well region 722 may be a P-type well region (PW). The well region 712 may be a N-type well region (NW). The heavily doped regions 742 and 752 are disposed in the well region 712, and the heavily doped region 762 is disposed in the well region 722. The heavily doped region 742 is electrically connected an anode end AE of the thyristor 702, and the heavily doped regions 752, 762 are common electrically connected to a cathode end CE of the thyristor 702. The heavily doped region 742 is a P-type heavily doped region (P+), and heavily doped regions 752 and 762 are N-type heavily doped regions (N+).

Figure 7C:
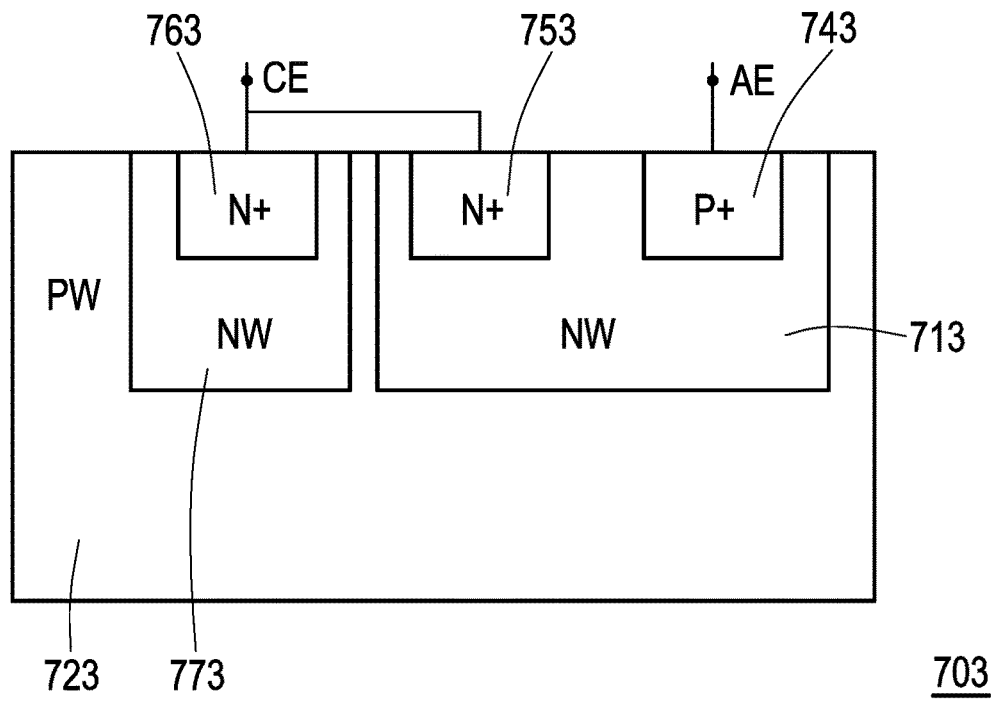

In FIG. 7C, a thyristor 703 includes well regions 713, 723, 773 and heavily doped region 743, 753 and 763. The well region 723 can be a substrate. The well region 713 and 773 are disposed in the well region 723, and the well region 713 and 773 are isolated to each other. Where the well region 723 may be a P-type well region (PW), and the well region 713 and 773 may be N-type well regions (NW). The heavily doped regions 743 and 753 are disposed in the well region 713, and the heavily doped region 763 is disposed in the well region 773. The heavily doped region 743 is electrically connected an anode end AE of the thyristor 703, and the heavily doped regions 753, 763 are common electrically connected to a cathode end CE of the thyristor 703. The heavily doped region 743 is a P-type heavily doped region (P+), and heavily doped regions 753 and 763 are N-type heavily doped regions (N+).

Figure 7D:
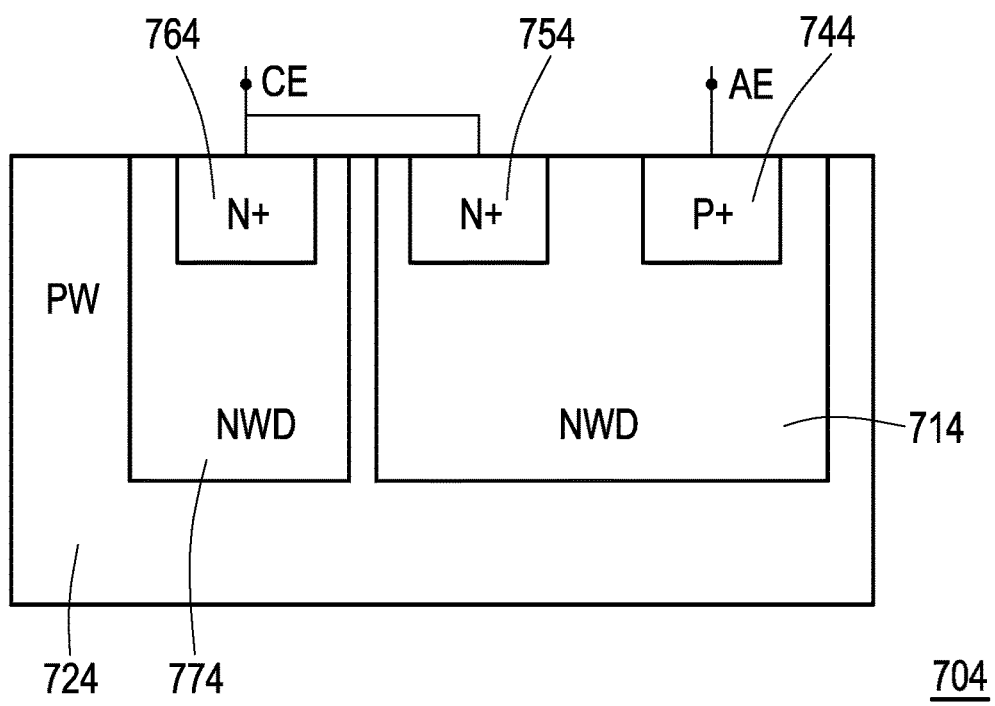

In FIG. 7D, a thyristor 704 includes well regions 714, 724, 774 and heavily doped region 744, 754 and 764. The well region 724 can be a substrate. The well region 714 and 774 are disposed in the well region 724, and the well region 714 and 774 are isolated to each other. Where the well region 724 may be a P-type well region (PW), and the well region 714 and 774 may be N-type deep well regions (NWD). The heavily doped regions 744 and 754 are disposed in the well region 714, and the heavily doped region 763 is disposed in the well region 774. The heavily doped region 744 is electrically connected an anode end AE of the thyristor 704, and the heavily doped regions 754, 764 are common electrically connected to a cathode end CE of the thyristor 704. The heavily doped region 744 is a P-type heavily doped region (P+), and heavily doped regions 754 and 764 are N-type heavily doped regions (N+).

In summary of the foregoing, in the thyristor of the disclosure, an embedded diode is provided. When a forward bias is applied between the anode and the cathode of the thyristor, the embedded diode can be turned on and provide a conduction path. Furthermore, when the embedded diode is turned on, the voltage of the second end of the floating first transistor in the thyristor is pulled up, such that the second transistor is turned on to provide another conduction path. That is, in the thyristor of the disclosure, dual conduction paths can be provided, improving the conduction efficiency and current discharge capability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A thyristor, comprising:
a first transistor, having a first end serving as an anode end; and
a second transistor, having a control end coupled to a second end of the first transistor, a first end coupled to a control end of the first transistor, and a second end coupled to the first end of the second transistor and serving as a cathode end.

2. The thyristor described in claim 1, wherein the first transistor is a PNP-type bipolar transistor and the second transistor is an NPN-type bipolar transistor, the first end of the first transistor is an emitter, the second end of the first transistor is a collector, the second end of the second transistor is an emitter, and the first end of the second transistor is a collector.

3. The thyristor described in claim 1, further comprising:
a first resistor, coupled between the second end of the first transistor and the control end of the second transistor; and
a second resistor, coupled between the first end of the second transistor and the control end of the first transistor.

4. The thyristor described in claim 1, wherein when a forward bias is received between the anode end and the cathode end, a first conduction path is formed between the first end of the first transistor, the control end of the first transistor and the first end of the second transistor, and a second conduction path is formed between the first end of the first transistor, the control end of the first transistor, the first end of the second transistor, the second end of the first transistor, the control end of the second transistor and the second end of the second transistor.

5. A thyristor, comprising:
a first well region;
a first heavily doped region, disposed in the first well region and electrically coupled to an anode end;
a second heavily doped region, disposed in the first well region and electrically coupled to a cathode end;
a second well region; and
a third heavily doped region, disposed in the second well region and electrically coupled to the cathode end.

6. The thyristor described in claim 5, wherein electrical conduction types of the first well region, the second heavily doped region, and the third heavily doped region are a same first electrical conduction type, electrical conduction types of the first heavily doped region and the first well region are a same second electrical conduction type, and the second well region is disposed in the first well region, wherein the first electrical conduction type is an N type and the second electrical conduction type is a P type.

7. The thyristor described in claim 6, wherein the first heavily doped region, the first well region, and the second well region form a first transistor, and the first well region, the third heavily doped region, and the second well region form a second transistor.

8. The thyristor described in claim 7, wherein the first transistor is a PNP-type bipolar transistor and the second transistor is an NPN-type bipolar transistor.

9. The thyristor described in claim 5, further comprising:
a deep well region, disposed in the first well region,
wherein the second well region is disposed in the deep well region, and the second heavily doped region is disposed in the deep well region.

10. The thyristor described in claim 9, wherein electrical conduction types of the substrate, the first heavily doped region, and the second well region are a same first electrical conduction type, electrical conduction types of the second heavily doped region, the third heavily doped region, and the deep well region are a same second electrical conduction type, and the first electrical conduction type is complementary to the second electrical conduction type, the first electrical conduction type is a P type and the second electrical conduction type is an N type.

11. The thyristor described in claim 10, wherein the first heavily doped region, the first well region, the deep well region, and the second well region form a first transistor, and the second heavily doped region, the second well region, the deep well region, and the third heavily doped region form a second transistor.

12. The thyristor described in claim 11, wherein the first transistor is a PNP-type bipolar transistor and the second transistor is an NPN-type bipolar transistor.

13. The thyristor described in claim 5, further comprising:
a third well region, disposed in the first well region,
wherein the first heavily doped region is disposed in the third well region, and the third well region and the second well region are isolated from each other.

14. The thyristor described in claim 13, wherein electrical conduction types of the first heavily doped region, the second well region, and the third well region are a same first electrical conduction type, electrical conduction types of the first well region, the second heavily doped region, and the third heavily doped region are a same second electrical conduction type, and the first electrical conduction type is complementary to the second electrical conduction type, the first electrical conduction type is a P type and the second electrical conduction type is an N type.

15. The thyristor described in claim 14, wherein the first heavily doped region, the third well region, the first well region, and the second well region form a first transistor, and the second heavily doped region, the second well region, the first well region, and the third heavily doped region form a second transistor.

16. The thyristor described in claim 15, wherein the first transistor is a PNP-type bipolar transistor and the second transistor is an NPN-type bipolar transistor.

17. The thyristor described in claim 5, wherein the first well region is disposed in the second well region.

18. The thyristor described in claim 17, wherein the first well region is an N-type deep well region.

19. The thyristor described in claim 17, further comprising:
a third well region, disposed in the second well region,
wherein the third heavily doped region is disposed in the third well region, and the third well region is isolated to the first well region.

20. The thyristor described in claim 19, wherein the second well region and the third well region are both N-type deep well regions.

\* \* \* \* \*